(12) United States Patent
Yu et al.

(10) Patent No.: US 11,033,860 B2
(45) Date of Patent: Jun. 15, 2021

(54) TIO2 NANOFILTRATION MEMBRANES PREPARED BY MOLECULAR LAYER DEPOSITION FOR WATER PURIFICATION

(71) Applicant: University of South Carolina, Columbia, SC (US)

(72) Inventors: Miao Yu, Pittsford, NY (US); Zhuonan Song, West Columbia, SC (US)

(73) Assignee: University of South Carolina, Columbia, SC (US)

( * ) Notice: Subject to any disclaimer, the term of this patent is extended or adjusted under 35 U.S.C. 154(b) by 346 days.

(21) Appl. No.: 15/243,148

(22) Filed: Aug. 22, 2016

(65) Prior Publication Data
US 2017/0050150 A1 Feb. 23, 2017

Related U.S. Application Data

(60) Provisional application No. 62/207,975, filed on Aug. 21, 2015.

(51) Int. Cl.
*B01D 67/00* (2006.01)
*C02F 1/44* (2006.01)
(Continued)

(52) U.S. Cl.
CPC ......... *B01D 67/0072* (2013.01); *B01D 69/10* (2013.01); *B01D 71/024* (2013.01);
(Continued)

(58) Field of Classification Search
CPC ............. B01D 67/0072; B01D 71/025; C23C 18/1216
See application file for complete search history.

(56) References Cited

U.S. PATENT DOCUMENTS

| 2007/0037412 A1* | 2/2007 | Dip ..................... C23C 16/0236 438/785 |
| 2010/0219079 A1* | 9/2010 | Routkevitch ........ B01D 53/228 205/175 |
| 2011/0168560 A1* | 7/2011 | Afzali-Ardakani ......................... B01D 61/025 204/521 |

OTHER PUBLICATIONS

Molecular Layer Deposition of Titanicone Films using TiCl4 and Ethylene Glycol or Glycerol: Growth and Properties Aziz I. Abdulagatov, Robert A. Hall, Jackson L. Sutherland, Byoung H. Lee, Andrew S. Cavanagh, and Steven M. George Chemistry of Materials 2012 24 (15), 2854-2863 Publication Date: Jun. 29, 2012.*

(Continued)

*Primary Examiner* — Alex A Rolland
(74) *Attorney, Agent, or Firm* — Dority & Manning, P.A.

(57) ABSTRACT

Methods are provided for preparing $TiO_2$ nanofiltration membranes for water purification are provided. The method can include supplying a titanium precursor gas into a reaction chamber, where the titanium precursor gas reacts with a base support of an anodic aluminum oxide, and the base support of an anodic aluminum oxide has a surface defining a plurality of pores therein. The reaction chamber can then be evacuated to remove any unreacted titanium precursor gas, and an alkoxide precursor gas can be supplied into a reaction chamber such that the alkoxide precursor gas reacts to with the titanium on the base support to form a hybrid titanium alkoxide. Thereafter, the base support cab be heated to remove the organic component to leave titanium oxide on the surface of the base support.

6 Claims, 13 Drawing Sheets

(51) Int. Cl.
| | |
|---|---|
| B01D 71/02 | (2006.01) |
| C23C 16/40 | (2006.01) |
| C23C 16/56 | (2006.01) |
| C23C 16/44 | (2006.01) |
| B01J 20/28 | (2006.01) |
| B01J 20/32 | (2006.01) |
| B01J 20/30 | (2006.01) |
| B01J 20/06 | (2006.01) |
| B01D 69/10 | (2006.01) |
| B01D 61/02 | (2006.01) |

(52) U.S. Cl.
CPC ......... *B01J 20/06* (2013.01); *B01J 20/28033* (2013.01); *B01J 20/3078* (2013.01); *B01J 20/3236* (2013.01); *C02F 1/442* (2013.01); *C23C 16/405* (2013.01); *C23C 16/4408* (2013.01); *C23C 16/56* (2013.01); *B01D 61/027* (2013.01); *B01D 2323/08* (2013.01); *B01D 2325/20* (2013.01); *C02F 2303/04* (2013.01)

(56) References Cited

OTHER PUBLICATIONS

Benfer et al., "Development and Characterization of Ceramic Nanofiltration Membranes", Separation and Purification Technology, 22-3, 2001, pp. 231-237.

Chen et al., "Toward a Highly Efficient Photocatalysis: A Flow-Through Pt@TiO2@AAO Membrane Nanoreactor Prepared by Atomic Layer Deposition", Chemical Communications, 50, 2014, pp. 4379-4382.

Ersan et al., "N-Nitrosodimethylamine (NDMA) Precursors Leach from Nanofultration Membranes", Environmental Science and Technology Letters, 2, 2015, pp. 66-69.

Gould et al., "Stabilizing Ni Catalysts by Molecular Layer Deposition for Harsh, Dry Reforming" Conditions, ACS Catalysis, 4, 2014 pp. 2714-2717.

Han et al., "Ultrathin Graphene Nanofiltration Membrane for Water Purification", Advanced Functional Materials, 23, 2013, pp. 369-3700.

Hilal et al., "A Comprehensive Review of Nanofiltration Membranes: Treatment, Pretreatment, Modelling, and Atomic Force Miscroscopy", Desalination, 170, 2004, pp. 281-308.

Hu et al., "Enabling Graphene Oxide Nanosheets as Water Separation Membranes", Environmental Science and Technology, 47, 2013, pp. 3715-3723.

Lau et al., "Polymeric Nanofiltration Membranes for Textile Dye Wastewater Treatment: Preparation, Performance Evaluation, Transport Modellingmand Fouling Control—A Review", Desalination, 245, 2009, pp. 321-348.

Liang et al., "An Overview of Highly Porous Oxide Films with Tunable Thickness Prepared by Molecular Layer Deposition", Current Opinion in Solid State and Materials Science, 19, 2015, pp. 115-125.

Liu et al., "Synthesis of Chiral TiO2 Nanofobre With Electron Transition-Based Opitcal Activity", Nature Communications, 3, 2012, p. 6.

Marchetti et al., "Molecular Separation with Organic Solvent Nanofiltration: A Critical Review", Chemistry Review, 114, 2014, pp. 1-735-10806.

Mohammad et al., "Nanofiltration Membranes Review: Recent Advances and Future Propects", Desalination, 356, 2015, pp. 226-254.

Peterson et al., "Development of TiO2 Membranes for Gas Phase Nanofiltration", Journal of Membrane Science 94, 1994, pp. 103-109.

Puhlfurss et al., "Microporous TiO2 Membranes with a Cut Off <500 Da", Journal of Membrane Science, 174, 2000, pp. 123-133.

Sekulic et al., "A Microporous Titania Membrane for Nanofiltration and Pervaporation", Advanced Materials, 16, 2004, pp. 1546-1500.

Sekulic et al., "Microporous Silica and Doped Silica Membrane for Alcohol dehydration by Pervaporation", Desalination, 148, 2002, pp. 19-23.

Shang at al., "Encapsulation of Supported Metal Nanoparticles with an Ultra-Thin Porous Shell for Size-Selective Reactions", Chemical Communications, 49, 2013, pp. 10067-10069.

Song et al., "Composite 5A Zeolite with Ultrathin POrous TiO2 Coating for Selective Gas Absorption", Chemical Communications, 51, 2015, pp. 373-375.

Van Der Bruggen et al., "Chemical Modification of Polyethersulfone Nanofiltration Membranes: A Review", Journal of Applied Polymer Science, 114, 2009, pp. 630-642.

Van Gestel et al., "Salt Retention in Nanofiltration with Multilayer Ceramic TiO2 Membranes", Journal of Membrane Science, 209, 2002, pp. 379-389.

Xu et al., "Sol-Gel Route to Synthesis of Microporous Ceramic Membranes: Preparation and Characterization of Microporous TiO2 and ZrO2 Xerogels", Journal of the American Ceramic Society, 77, 1994, pp. 1939-1945.

Yang et al., "Highly Ordered Pb(Zr0.52Ti0.48)O-3 Piezoelectric Nanorod Arrays", Nanotechnology, 24, 2013, p. 6.

Yu et al., "H2 Separation Using Defect-Free, Inorganic Composite Membranes", Journal of the American Ceramic Society, 133, 2011, pp. 1748-1750.

Zhou et al., "Fabrication of Organic Interfacial Layers by Molecular Layer Deposition: Present Status and Future Opportunities", Journal of Vacuum Science and Technology, A31, 2013, p. 18.

Zhou et al., "Cross-Linked Ultrathin Polyurea Films via Molecular Layer Depostion", Macromolecules, 46, 2013, pp. 5638-5643.

Zhou et al., "NaA Zeolite/Carbon Nanocomposite Thin Films with High Permeance for CO2/N2 Separation", Separation and Purification Technology, 55, 2007, pp. 392-295.

\* cited by examiner

TIO2 NANOFILTRATION MEMBRANES PREPARED BY MOLECULAR LAYER DEPOSITION FOR WATER PURIFICATION

PRIORITY INFORMATION

The present application claims priority to U.S. Provisional Patent Application Ser. No. 62/207,975 titled "TiO$_2$ Nanofiltration Membranes Prepared by Molecular Layer Deposition for Water Purification" of Yu, et al. filed on Aug. 21, 2015, the disclosure of which is incorporated by reference herein.

GOVERNMENT SUPPORT CLAUSE

This invention was made with government support under 1402772 awarded by the National Science Foundation. The government has certain rights in the invention.

BACKGROUND

Water scarcity is one of the most serious global issues because of the growing freshwater use and depletion of usable fresh water resources. It is, therefore, in a great need to develop various energy-efficient water treatment technologies to realize water purification for different water sources and at different levels. Nanofiltration membranes are now widely used in drinking water and wastewater treatment, as well as pretreatment for desalination because of their ability to remove viruses, hardness, dissolved organic matter and salts. Generally, dominant materials in nanofiltration are polymers, such as cellulose acetate, polyamide, polyimide, and poly(ether)sulfone. Most of polymeric nanofiltration membranes have advantages of flexibility, simple preparation process, and relatively low cost. Compared with polymeric nanofiltration membranes, ceramic nanofiltration membranes have better chemical, thermal and mechanical stability, and long lifetime, and thus may be used in applications under extreme operating conditions. Currently, ceramic nanofiltration membranes are usually prepared by solution-based sol-gel method, which needs careful control of the deposition process to produce high quality membranes. Typically, in this process, a colloidal or polymeric solution is converted into a gel, and organic additives need to be added to control the hydrolysis and condensation of alkoxides. In addition, pore sizes of ceramic nanofiltration membranes are difficult to be precisely controlled at about 1 nm, especially for stable metal oxides, such as TiO$_2$, and membrane thickness may not be able to be controlled at the sub-nanometer scale. Attempts to prepare TiO$_2$ nanofiltration membranes started from 1990s, and the average pore sizes obtained in these initial studies were in the range of 1.5~4.0 nm. To date, the tightest reported TiO$_2$ nanofiltration membranes, prepared by optimizing the sol-gel processing conditions, had a pore size of ~0.9 nm. However, the hydrolysis conditions of titanium alkoxides need to be strictly controlled because of the extremely fast rate of hydrolysis to avoid any local excel of water at any moment.

SUMMARY

Objects and advantages of the invention will be set forth in part in the following description, or may be obvious from the description, or may be learned through practice of the invention.

Methods are generally provided for preparing TiO$_2$ nanofiltration membranes for water purification. In one embodiment, the method includes supplying a titanium precursor gas into a reaction chamber, where the titanium precursor gas reacts with a base support of an anodic aluminum oxide, and the base support of an anodic aluminum oxide has a surface defining a plurality of pores therein. The reaction chamber is then evacuated to remove any unreacted titanium precursor gas, and an alkoxide precursor gas is supplied into a reaction chamber such that the alkoxide precursor gas reacts to with the titanium on the base support to form a hybrid titanium alkoxide. Thereafter, the base support is heated to remove the organic component to leave titanium oxide on the surface of the base support.

Other features and aspects of the present invention are discussed in greater detail below.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures.

DEFINITIONS

Chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth.

As used herein, the prefix "nano" refers to the nanometer scale up to about 100 nm. For example, particles having an average diameter on the nanometer scale (e.g., from about 0.1 nm to about 100 nm) are referred to as "nanoparticles."

The term "organic" is used herein to refer to a class of chemical compounds that are comprised of carbon atoms. For example, an "organic polymer" is a polymer that includes carbon atoms in the polymer backbone, but may also include other atoms either in the polymer backbone and/or in side chains extending from the polymer backbone (e.g., oxygen, nitrogen, sulfur, etc.).

DETAILED DESCRIPTION

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

Figure 1A:
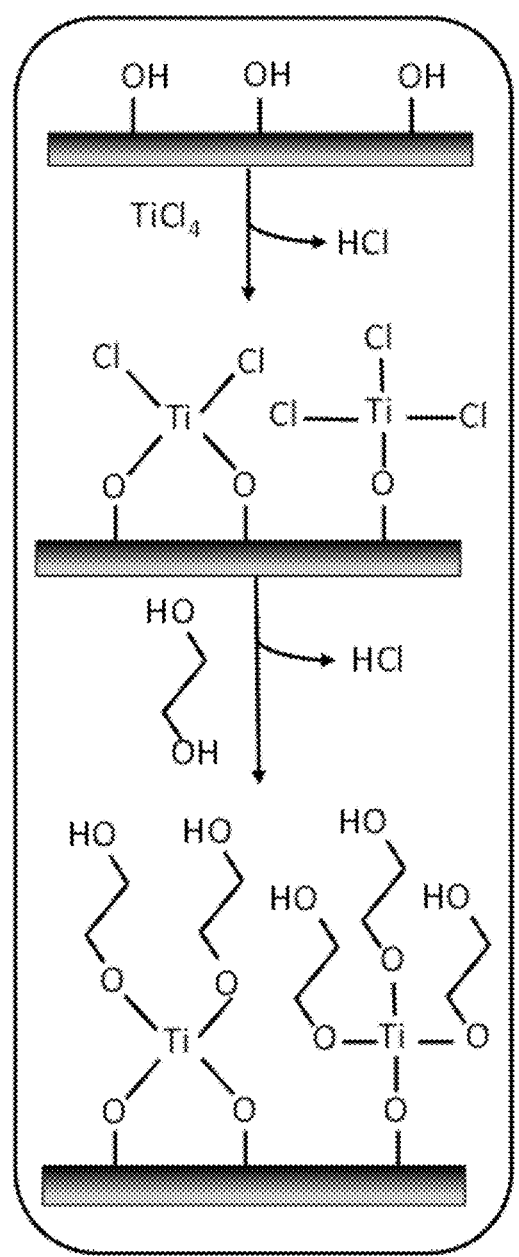
FIG. 1a is a schematic illustration of MLD surface reactions for titanium alkoxide coating growth using TiCl$_4$ and EG as precursors.

Molecular layer deposition (MLD) technique has been used to deposit ultra-thin coatings for metal catalysts stabilization, highly selective catalysts, and size-selective adsorption. MLD growth has been demonstrated for a variety of organic-inorganic hybrid films, such as alucone, zinc alkoxide, titanium alkoxide, and zirconium alkoxide by using suitable precursors. In MLD, two self-limiting surface reactions are conducted alternatively to deposit coatings on a substrate. During each surface reaction, precursor molecules react with surface reactive groups, such as —OH, and chemically bond a layer of precursor molecules on the surface; new reactive sites/functional groups on the linked precursor molecules will be utilized for further layer growth. FIG. 1a illustrates two surface reactions in one cycle of MLD using $TiCl_4$ and ethylene glycol (EG) as precursors to deposit titanium alkoxide coatings. The self-limiting nature of the surface reactions of MLD offers advantages, such as exquisite control over coating thickness at sub-nanometer level, conformal pinhole-free coatings on high aspect ratio structures, and scale-up capability.

Here, a method is generally provided for using MLD to fabricate $TiO_2$ nanofiltration membranes with excellent control of coating quality, thickness and nanometer-sized membrane pores, and their potential for water purification. Through the presently provided methods, MLD can become a new method for preparing ceramic nanofiltration membranes with well controlled thickness, composition and membrane pore sizes in a scalable way.

Figure 1B:
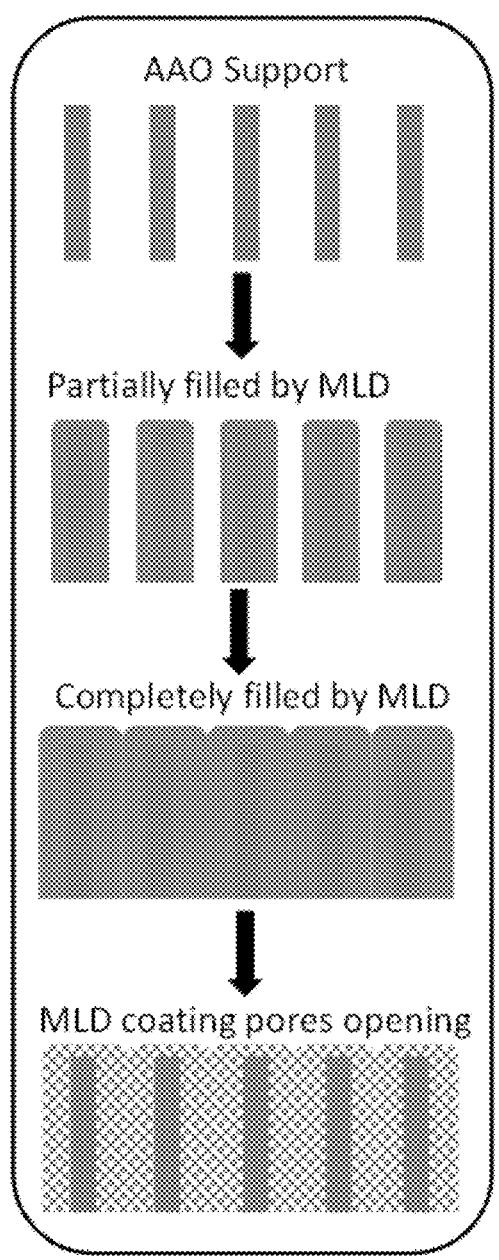
FIG. 1b is a step-by-step procedure to prepare the TiO$_2$ nanofiltration membranes using an AAO support by MLD and subsequent calcination to open pores.

Referring to FIGS. 1a and 1b, a method is sequentially shown for preparing a $TiO_2$ nanofiltration membrane for water purification. FIG. 1a shows the chemical reaction for a single MLD cycle of (1) supplying a titanium precursor gas to react with hydroxyl groups or oxygen groups on the aluminum oxide surface of the base substrate, (2) evacuating the reaction chamber to remove any unreacted titanium precursor gas, and (3) supplying an alkoxide precursor gas into a reaction chamber such that the alkoxide precursor gas reacts to with the titanium on the base support to form a hybrid titanium alkoxide. FIG. 1b shows that multiple MLD cycles can be used to completely fill the pores within the base substrate with the hybrid titanium alkoxide. Finally, the organic material can be removed from the hybrid titanium alkoxide, through heating, to leave a $TiO_2$ membrane within and/or on the pores of the base substrate. Each of these steps is discussed in greater detail below.

The base substrate is generally formed from an anodic aluminum oxide (AAO) that defines a plurality of pores in its surface. The pores generally have an average diameter (i.e., average pore size) on the nanoscale, such as about 5 nm to about 100 nm (e.g., about 10 nm to about 50 nm, such as about 15 nm to about 30 nm). Nanoporous Anodic Aluminum Oxide or AAO (also known as Porous Aluminum Oxide (PAO) or NanoPorous Alumina Membranes (NPAM)) is a self-organized material with honeycomb-like structure formed by high density arrays of uniform and parallel nanopores. AAO is formed by electrochemical oxidation (anodization) of aluminum in the conditions that balance the growth and the localized dissolution of aluminum oxide. In the absence of such dissolution, dense anodic alumina films are formed with limited thickness. The diameter of the nanopores can be controlled with great precision from as low as 5 nanometers to as high as several hundred nanometers, with pore length from few tens of nanometers to few hundred micrometers.

The base substrate formed from the nanoporous AAO, in particular embodiments, is cleaned by outgassing within a reaction chamber to remove any gases trapped within the pores. For example, the base substrate may be heated to a temperature over 150° C. (e.g., about 150° C. to about 300° C.) under vacuum.

The following deposition cycle is performed within a reaction chamber at controlled pressure and temperature. For example, in one embodiment, the base substrate can be kept at a substantially constant temperature during the reaction process. The reaction temperature can be, in one embodiment, from about 50° C. to about 200° C. (e.g., about 100° C.).

A titanium precursor gas can then be introduced gradually into the reactor chamber until the desired vapor pressure is achieved (e.g., about 10 Pa to about 30 Pa). The titanium precursor gas can then be allowed to react with the surface of the base substrate such that titanium oxide bonds are formed thereon. Referring to FIG. 1a, the titanium precursor gas is shown to be titanium tetrachloride which reacts with hydroxyl groups on the surface of the base substrate to form titanium-oxygen bonds and producing a byproduct of hydrogen chloride gas (HCl). Other titanium precursor gases can be utilized.

Following reaction of the titanium to the surface, the reaction chamber can be purged and/or evacuated to remove any unreacted titanium precursor gas. For example, an inert gas (e.g., nitrogen, argon, etc.) can be utilized to purge the reactor, followed by forming a vacuum therein.

An alkoxide precursor gas can then be introduced into the reaction chamber until the desired vapor pressure is achieved (e.g., about 3 Pa to about 20 Pa). The alkoxide precursor gas is allowed to react with the titanium bonded to the surface to form a hybrid titanium alkoxide. Referring to FIG. 1a, ethylene glycol is reacted with the exposed titanium chloride bonds on the surface of the substrate. Upon reaction, the ethylene glycol replaces the chlorine atom bonded to the titanium to generate a byproduct of hydrogen chloride gas (HCl).

A MLD cycle is formed from fixed sequential steps of (1) exposing the substrate to the titanium precursor gas, (2) purging the reaction chamber, and (3) exposing the substrate to the alkoxide precursor gas. This MLD cycle can be repeated to control the level of deposition of the titanium oxide on the substrate. For example, FIG. 1b shows a substrate formed of an AAO support defining a plurality of pores therein. A first MLD cycle partially fills the pores with the hybrid titanium alkoxide material bonded thereon and therein. Additional MLD cycles completely fill the pores with the hybrid titanium alkoxide material.

Finally, after the hybrid titanium alkoxide material is formed on the base substrate, the organic compound can be removed from the hybrid titanium alkoxide material through heating (e.g., a calcination-like process). For example, the hybrid titanium alkoxide material can be gradually heated to about 200° C. or higher (e.g., about 250° C. or higher, such as about 250° C. to about 350° C.), kept at that heated temperature, and then gradually cooled back to room temperature. This heating process can be achieved in air, in an inert atmosphere, or under vacuum.

EXAMPLES

In this study, molecular layer deposition (MLD) was used as a novel and highly controllable method to prepare $TiO_2$ nanofiltration membranes with approximately 1 nm pores for water purification. The number of deposition cycles and precursors ($TiCl_4$ and ethylene glycol) were used to control membrane quality and final pore sizes, respectively. Optimized $TiO_2$ nanofiltration membranes had a pure water flux as high as ~48 L $m^{-2} \cdot h^{-1} \cdot bar^{-1}$ and exhibited a rejection of 96% for Methylene blue. Salt rejection measurements showed moderate rejection (~28% and ~32%) of NaCl and $NaSO_4$, and high rejection (~64%) of $CaSO_4$.MLD, as a new ceramic nanofiltration membrane preparation technique, has great potential to realize excellent control of membrane composition, thickness and potentially pore sizes in a scalable way.

$TiO_2$ nanofiltration membranes were prepared for the first time by using a novel technique. Influence of cycles of MLD on hybrid coating quality and effect of calcination temperature on pore opening were investigated. Our results showed a defect-free, dense titanium alkoxide MLD coating can be formed after complete support pore filling, and approximately 1 nm pores can be effectively generated by calcination at 250° C. in air. The AAO-60 TiO2 membrane showed a high pure water flux of 48 L/(m2·h·bar) and high rejection for MB and moderate to high rejection for salts. Compared with traditional sol-gel method, MLD has the potential advantages of precise pore size control, simple fabrication process and ability to scale up.

1.1 Experimental Methods: Molecular Layer Deposition Process

Titanium alkoxide MLD coatings were deposited using titanium tetrachloride ($TiCl_4$; 99.9%, Sigma Aldrich) and ethylene glycol ($C_2H_6O_2$; 99%, Alfa Aesar) as precursors. Each MLD cycle started with 240 sec vacuum. $TiCl_4$ was then gradually introduced into the reactor as a vapor until a pressure of 20 Pa and settled for 120 sec to allow the surface reaction; 240 sec vacuum was followed to evacuate extra unreacted $TiCl_4$. Ultrahigh purity $N_2$ (Airgas) was used to purge the reactor at 20 sccm for 30 second to further clean the reactor. Then, 240 sec vacuum was applied to evacuate $N_2$. The above operation was repeated except that $TiCl_4$ was replaced by ethylene glycol at 6.7 Pa. This whole process is one titanium alkoxide MLD cycle. All MLD processes was conducted at 100° C. A home-designed, computer-controlled reaction system was used for desired cycles of MLD.

1.2 Experimental Methods: Membranes Preparation

Membrane preparation procedure was shown schematically in FIG. 1b. An anodic aluminum oxide (AAO) with an average top layer pore size of 20 nm (Whatman) was used as the base support. Before MLD, AAO supports were outgassed under vacuum at 200° C. for 1 hour. Different cycles of MLD were subsequently conducted to deposit titanium alkoxide coatings in AAO support pores. After completely filling AAO pores by hybrid titanium alkoxide, microporous $TiO_2$ membranes were formed by removing the organic compound in the dense hybrid coatings upon calcination in air at elevated temperatures for 4 h with a heating and cooling rate of 1° C./min. Tubular alumina support with 8-nm pores was also used for depositing titanium alkoxide coatings by MLD. MLD modified alumina support was then used for studying temperature effect on pore opening of the hybrid coatings by measuring gas permeation.

1.3 Experimental Methods: Membranes Characterization

Field emission scanning electron microscopy (FESEM, Zeiss Ultra Plus) was used to observe the morphology of AAO before and after MLD. Surface chemical composition of AAO support and $TiO_2$ coated AAO was analyzed by X-ray photoelectron spectroscopy (XPS, Kratos Axis Ultra DLD instrument equipped with a monochromated Al Ka x-ray source and hemispherical analyzer capable of an energy resolution of 0.5 eV). $N_2$ adsorption isotherms at 77 K were measured using a Micromeritcs ASAP 2020 unit. Prior to adsorption measurement, samples were degassed in situ at 250° C. for 10 h. Pore size distribution was calculated using adsorption branch of the isotherms. X-ray powder diffraction (XRD) measurement was carried out using a Rigaku MiniFlex II diffractometer with Cu Kα radiation (λ, =0.15418 nm). Double sided tape was applied to glue the samples to the hollowed XRD sample holder. The diffraction data was recorded for 2θ angles between 5° and 50°.

1.4 Experimental Methods: Membrane Performance Tests

Liquid permeation performance was evaluated using a dead end, stirred cell filtration system (Sterlitech Corp.) with 300 mL total feed volume. The feed side was connected to a high-pressure nitrogen tank to control feed pressure. An electronic scale (Ohaus, CS Series) was used to measure permeate mass. DI water was used in all permeation measurements.

Aqueous solutions of Methylene blue (MB) (6.4 mg/L), NaCl (10 mM), $Na_2SO_4$ (10 mM), and $CaSO_4$ (10 mM) were used to evaluate water purification performance of the prepared $TiO_2$ nanofiltration membranes. All chemicals were obtained from Sigma-Aldrich, and no pH was adjusted in the prepared solutions. In each rejection test, liquid permeation was stabilized for 3 h to eliminate the adsorption effect of $TiO_2$. Concentration of MB in the collected permeate was analyzed using a UV-vis spectrophotometer at a wavelength of 292 nm. Concentration of NaCl, $Na_2SO_4$, and $CaSO_4$ was measured by a conductivity meter (Pour Grainger International, Lake Forest, Ill., USA).

2.1: $TiO_2$ Nanofiltration Membrane Characterization

Figure 2A:
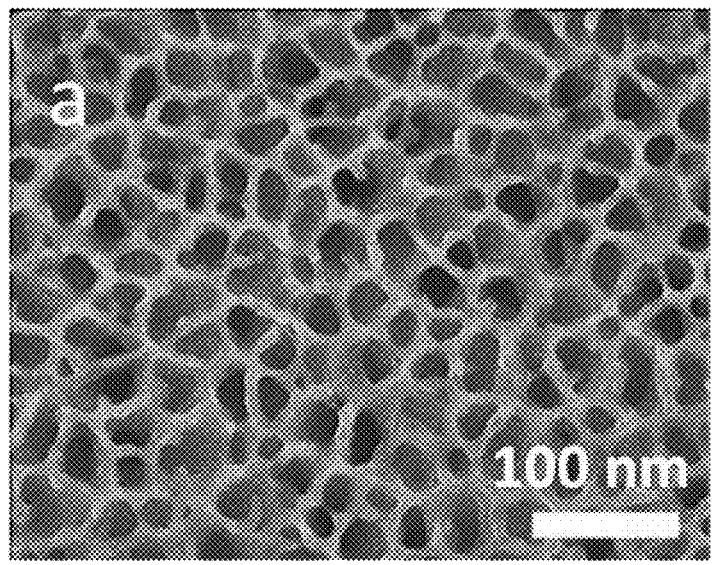
FIG. 2a shows a FESEM image of the top-surface of AAO support. All MLD coatings have been calcined at 250° C. in air, according to the Examples.
Figure 2B:
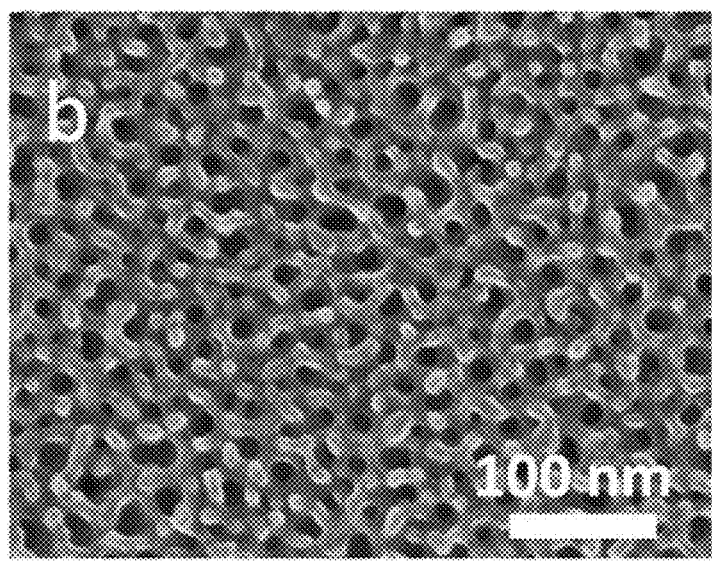
FIG. 2b shows a FESEM image of the top-surface of AAO support, AAO-40TiO$_2$ membrane. All MLD coatings have been calcined at 250° C. in air, according to the Examples.
Figure 2C:
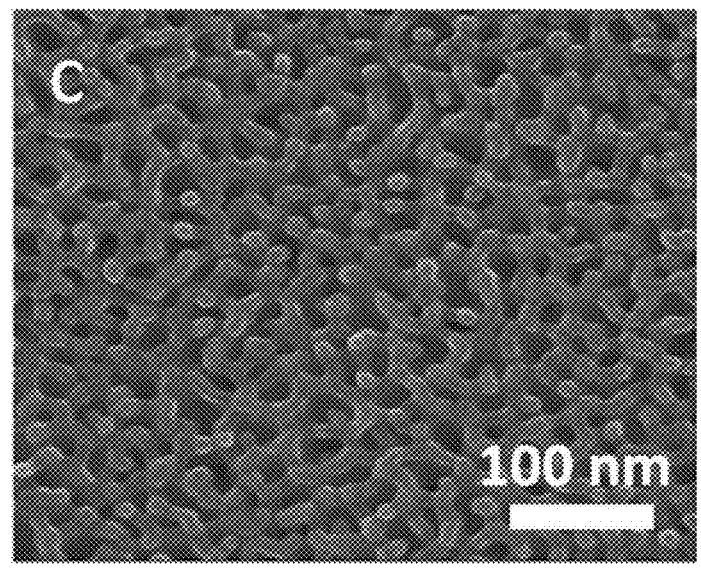
FIG. 2c shows a FESEM image of the top-surface of AAO support, AAO-60TiO$_2$ membrane. All MLD coatings have been calcined at 250° C. in air, according to the Examples.
Figure 2D:
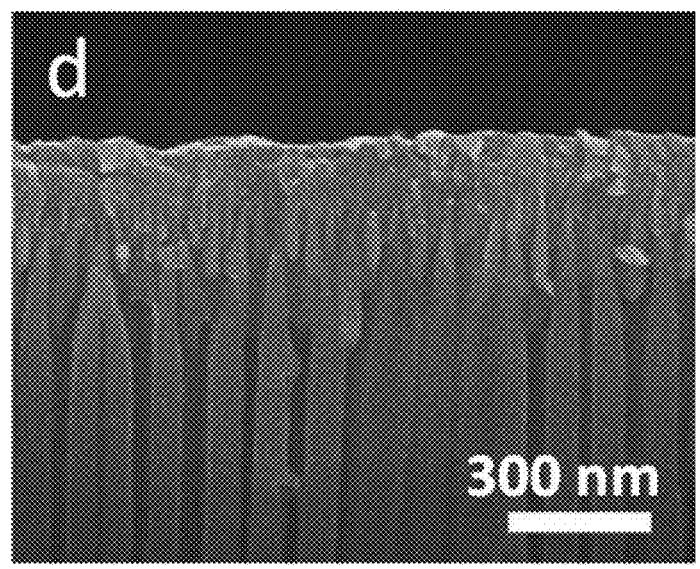
FIG. 2d shows a FESEM image of the cross-section of a AAO-60TiO$_2$ membrane. All MLD coatings have been calcined at 250° C. in air, according to the Examples.
Figure 3A:
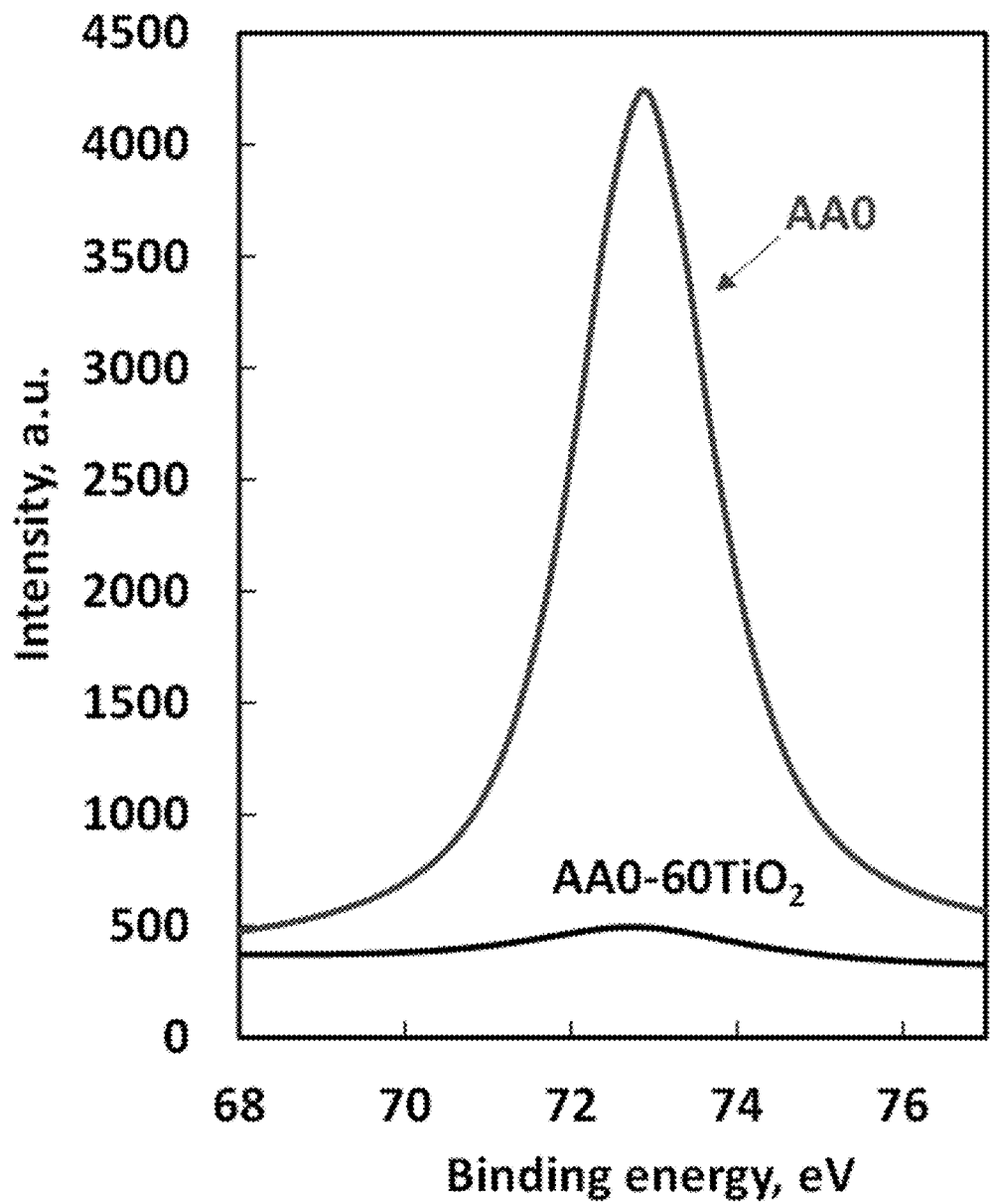
FIG. 3a shows the XPS spectra (Al 2p) of AAO and AAO-60TiO$_2$ (after calcination), according to the Examples.
Figure 3B:
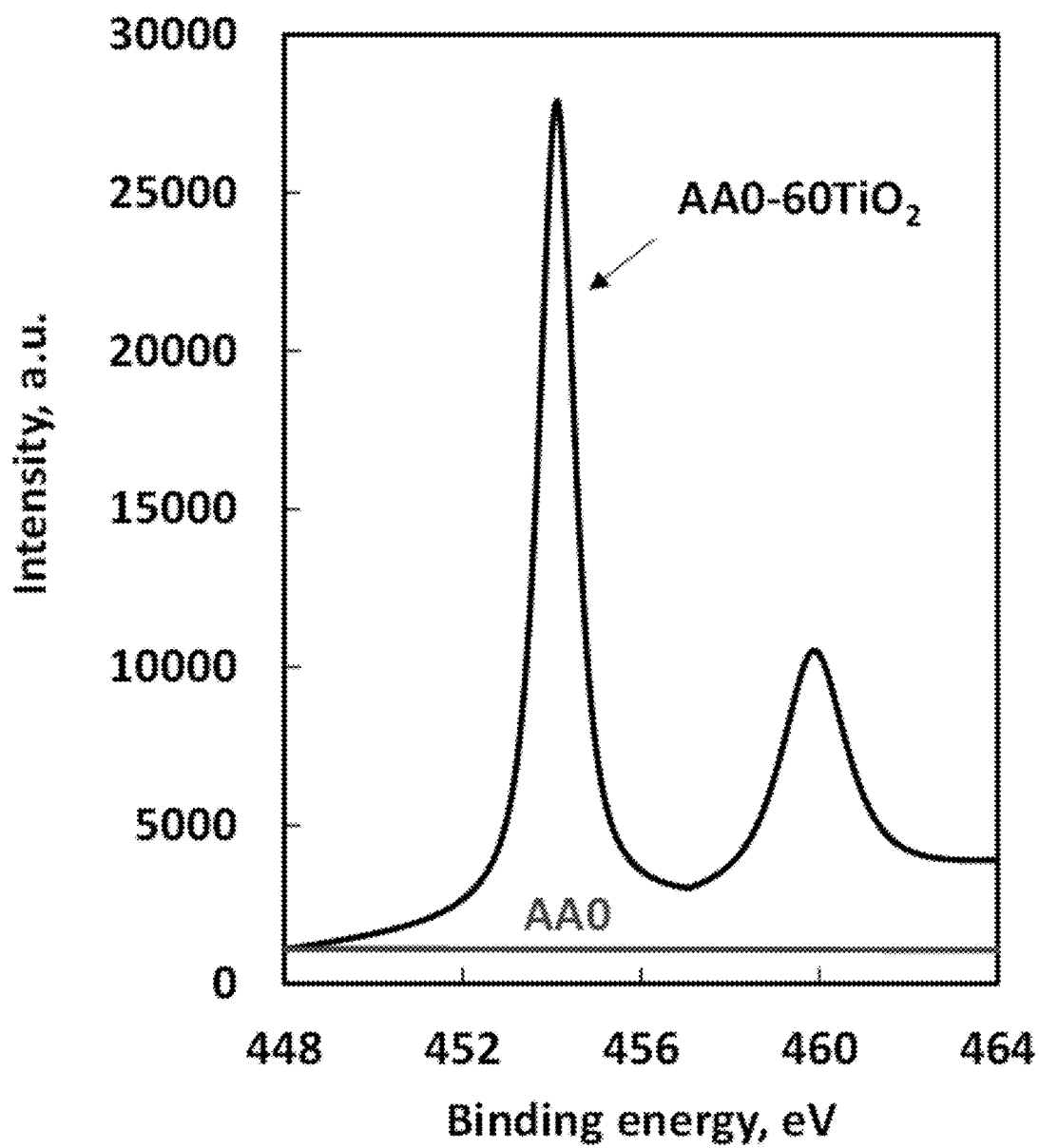
FIG. 3b shows the XPS spectra (Ti 2p) of AAO and AAO-60TiO$_2$ (after calcination), according to the Examples.
Figure 4:
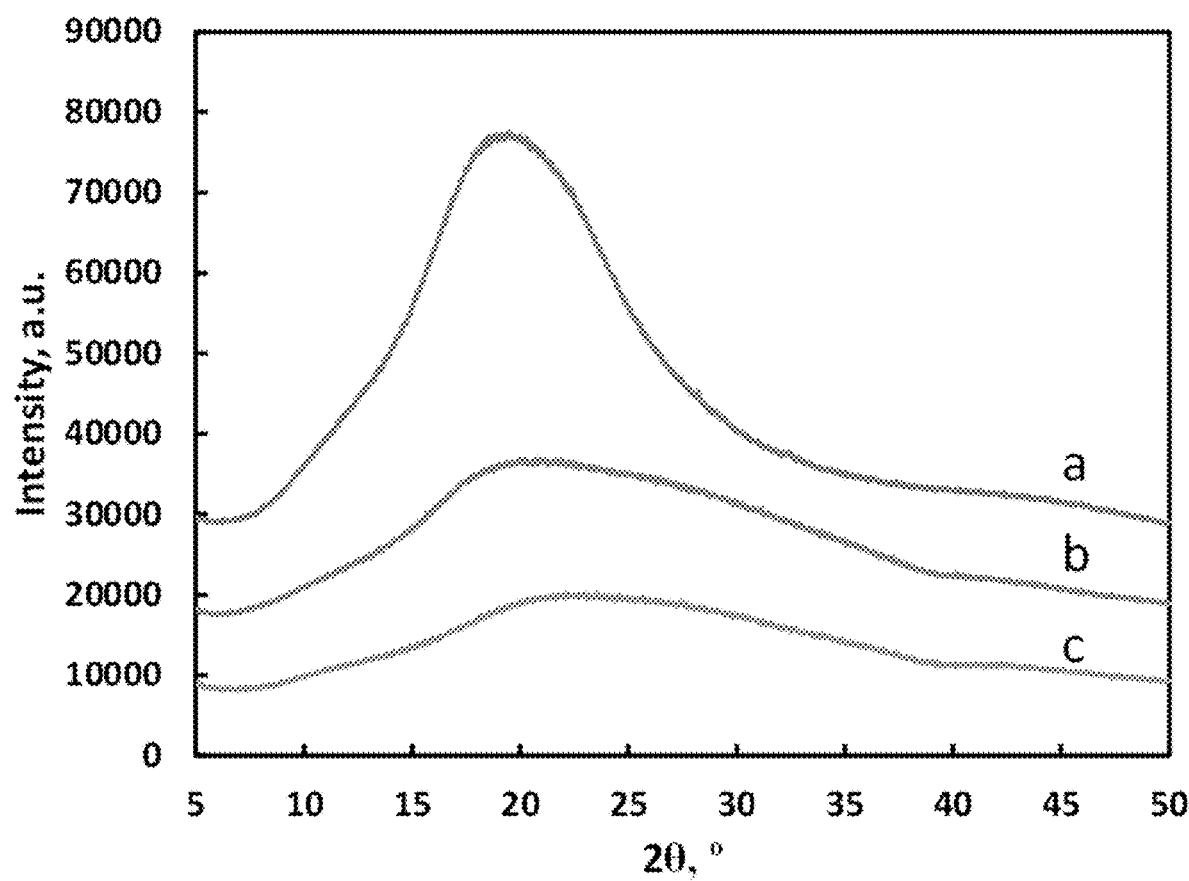
FIG. 4 shows XRD patterns of double sided tapes (a), AAO support (b), and the AAO-60TiO2 membrane (c), according to the Examples.
Figure 5:
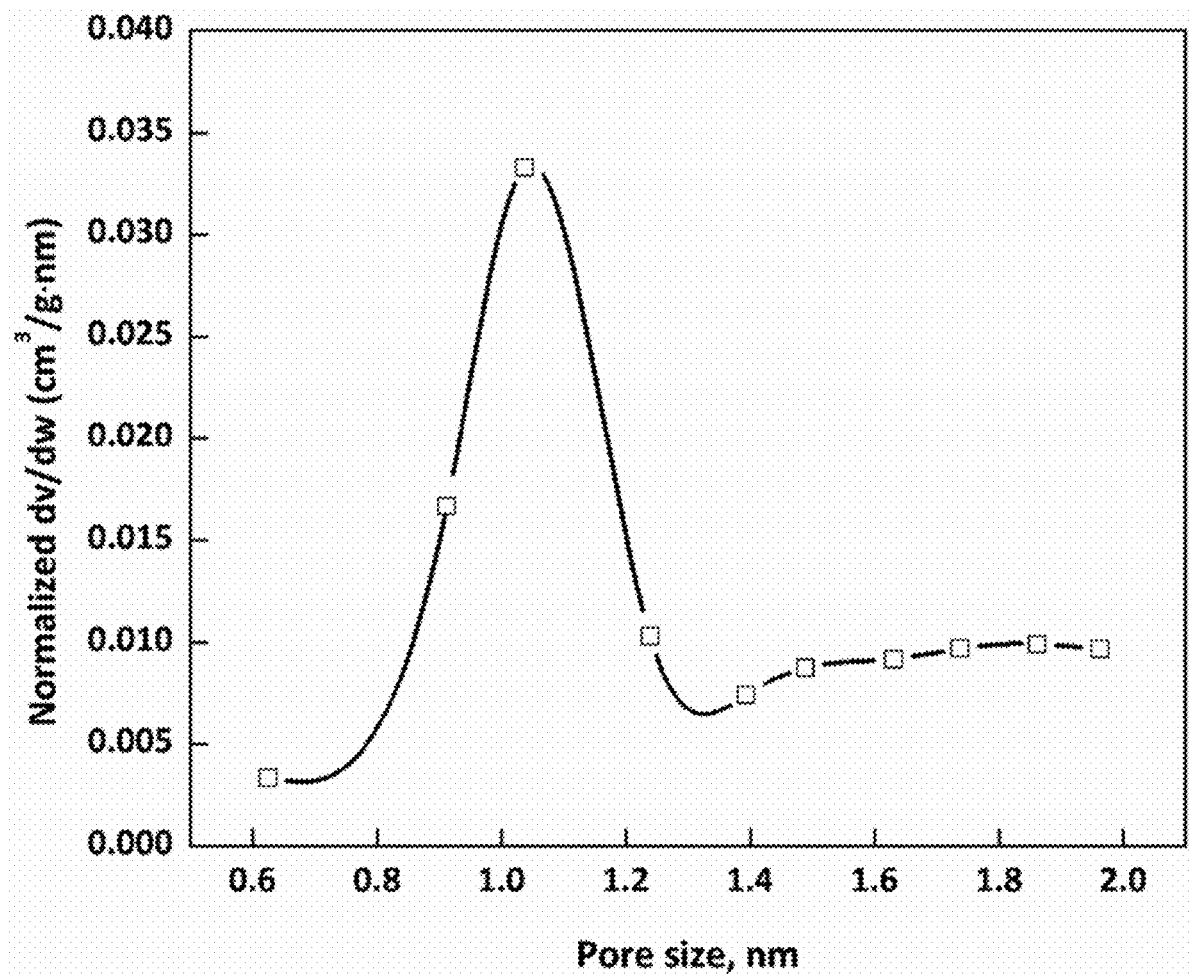
FIG. 5 shows a chart of the pore size distribution of the AAO-60TiO$_2$ membrane, according to the Examples.

FESEM was performed to image the surface morphology of the AAO support before and after depositing $TiO_2$ coatings. The surface view of the AAO support exhibited a porous structure having 20-40 nm pores, as shown in FIG. 2a. After 40 cycles of MLD on AAO support (AAO-40$TiO_2$; corresponding abbreviations for AAO with different cycles of MLD were used in the following description), the effective pore sizes of the AAO support was greatly reduced (FIG. 2b) due to the conformal $TiO_2$ MLD coating deposited on the pore walls as well as on the surface of the support. However, at this stage, open pores were still visible, mainly because deposited MLD coating was not thick enough to completely fill the support pores. Besides, there was a pore size distribution of the AAO support, and thus some large pores were only partially filled by the MLD coating. When 60 cycles of MLD was applied, a much thicker coating was deposited to further fill the pores of the AAO support (FIG. 2c). FIG. 2d showed the cross-sectional view of the AAO-60$TiO_2$ membrane. The top layer with average 20-nm pores and a thickness of approximately 200 nm, which was supported on the bottom layer with larger pores of about 100 nm, has been completely filled with the $TiO_2$ MLD coating. Pressurized pure water permeation also confirmed that the MLD coating before calcination was dense, as discussed below. XPS was used to detect the surface elements of the AAO and the AAO-60$TiO_2$ membrane. For bare AAO support, FIG. 3a showed a substantial amount of aluminum on the top surface. However, after 60 cycles of MLD, aluminum in the AAO support on the top surface can hardly been seen due to shorter excited electron mean free path than the $TiO_2$ coating thickness. FIG. 3b confirmed that there was no Ti in the AAO support and the MLD coating was composed of titania. This is also consistent with our previous work of $TiO_2$ MLD coated 5A zeolite composite adsorbents. FIG. 4 showed XRD spectra of AAO and AAO-60 $TiO_2$ indicated that both AAO and AAO-60$TiO_2$ were amorphous in structure; the broad peak near 2θ of 30° matches that reported for amorphous AAO by Yang, and the broad peak in the range of 20 to 25° was attributed to amorphous $TiO_2$ as reported by Liu. FIG. 5 showed the pore size distribution of $TiO_2$ MLD coatings after calcination, which was centered at approximately 1 nm.

2.2: Hybrid MLD Coating Pore Opening by Calcination

Figure 6:
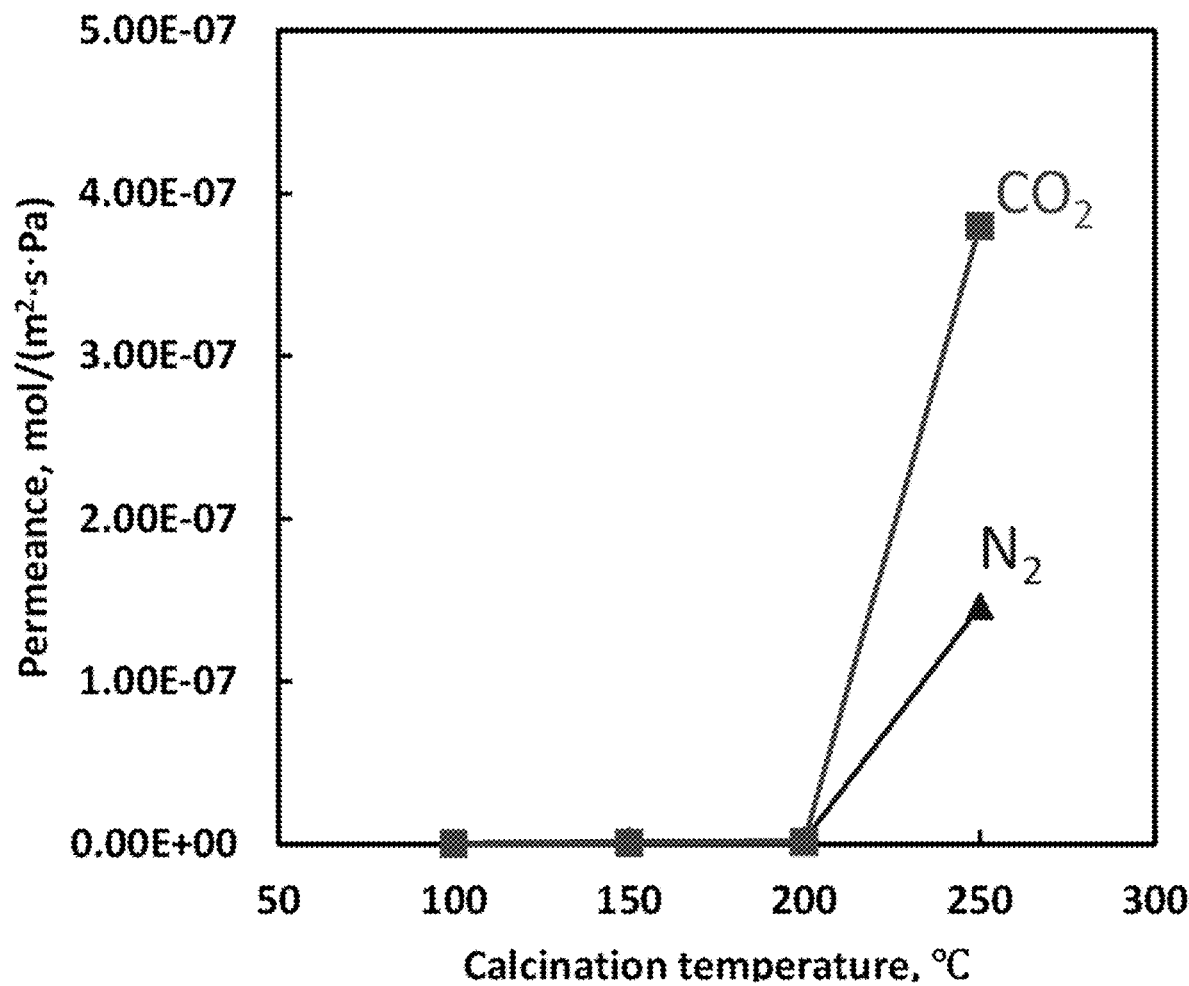
FIG. 6 shows a chart of the single gas permeation through the tubular α-Al$_2$O$_3$ support with 30 cycles of MLD after calcination at different temperatures in air, according to the Examples.

Effect of calcination temperature on the pore opening of the titanium alkoxide hybrid MLD coatings was studied by measuring single gas permeation. A tubular $\alpha$-$Al_2O_3$ support with 8-nm pores was used for this study. 30 cycles of MLD coating was deposited on the $\alpha$-$Al_2O_3$ support, and then gas permeation was measured after calcination at different temperatures. It was found that compared with bare support, $N_2$ permeance decreased approximately 5,000 times right after 30 cycles of MLD, indicating a uniform and pinhole-free titanium alkoxide MLD coating was successfully deposited on the support. FIG. 6 showed that below 200° C., both $CO_2$ and $N_2$ exhibited low gas permeances in the order of $10^{-10}$ mol/($m^2 \cdot s \cdot Pa$). When the calcination temperature increased to 250° C., a sharp increase of gas permeance was observed. This suggests that 250° C. may be an appropriate temperature to remove or at least partially remove the organic compounds and convert the hybrid MLD coatings into porous $TiO_2$ coatings. The ideal $CO_2/N_2$ permselectivity, defined as the ratio of single gas permeances, was ~2.6 after calcination at 250° C., whereas the corresponding permselectivity is ~0.8 for Knudsen-type diffusion in mesopores (2-50 nm). This indicates that micropore (<2 nm) diffusion may play a dominant role in the gas transport through the porous $TiO_2$ membrane.

2.3: Optimization of the MLD Cycles

Figure 7:
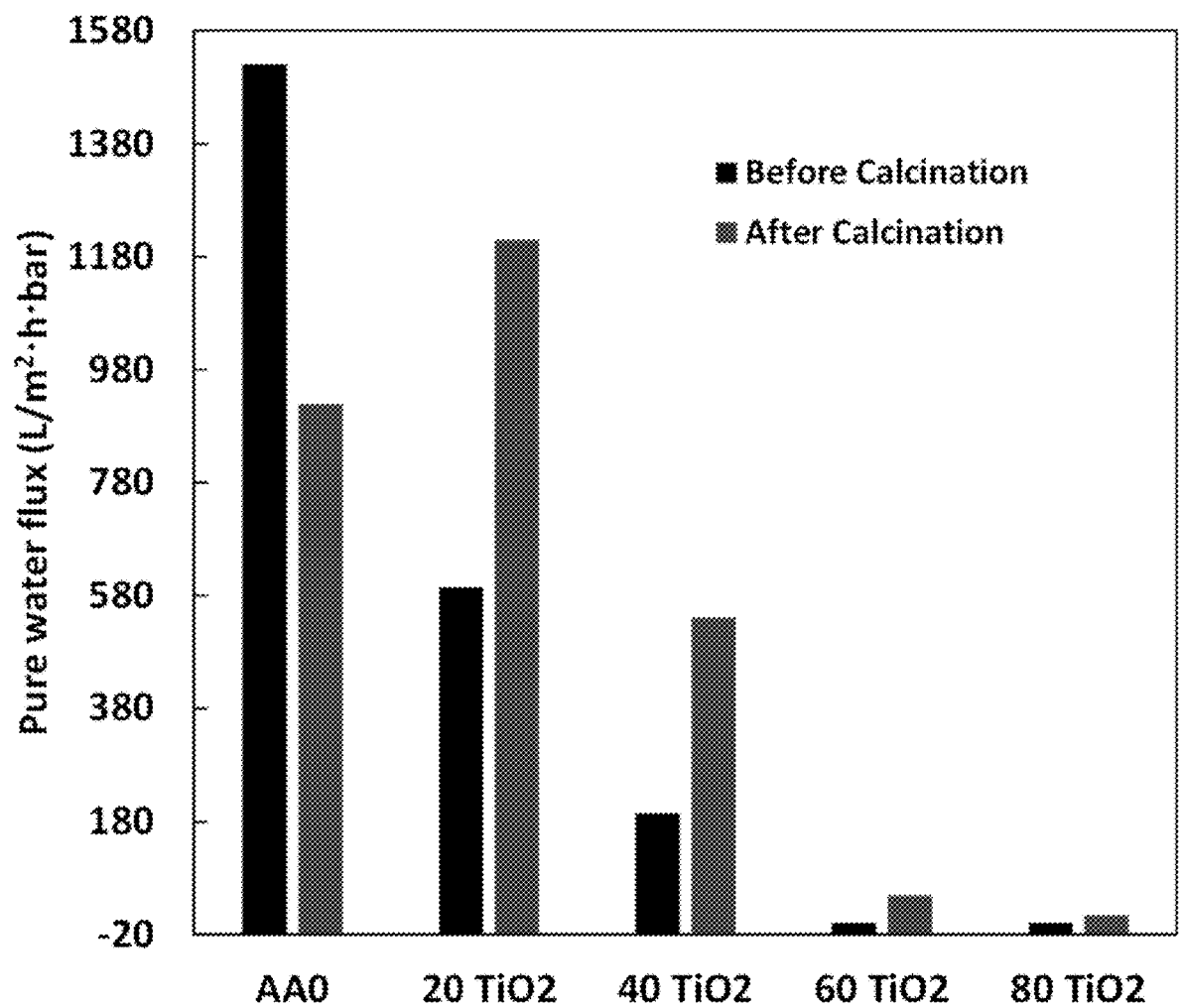
FIG. 7 shows a comparison of the pure water permeation through AAO with different cycles of MLD coatings before and after calcination at 250° C., according to the Examples.

Pressurized pure water permeation was used to optimize cycles of MLD to maximize water flux while ensuring high coating quality. Pure water flux through AAO coated with different cycles of MLD was measured before and after calcination at 250° C. As shown in FIG. 7, before calcination water flux of the AAO support was ~1520 L/$m^2 \cdot h \cdot bar$, and decreased to 595 and 195 L/$m^2 \cdot h \cdot bar$ after 20 and 40 cycles of TMLD, respectively. This is due to the gradual reduction of the AAO pores by the hybrid MLD coatings deposited on the AAO pore walls. But, after 40 cycles of MLD, the AAO support pores were still not completely filled. After 60 cycles of MLD, no observable water flux was found after 24 h permeation under pressure drop of 7 bar, and the pure water flux was estimated to be lower than our detection limit, 0.1 L/($m^2 \cdot h \cdot bar$). This suggests 60 cycles of MLD formed a defect-free, dense titanium alkoxide MLD coating on the AAO support. This is consistent with the SEM images of AAO-60$TiO_2$ in FIGS. 2c and d. After calcination in air at 250° C., a pure water flux as high as ~48 L/$m^2 \cdot h \cdot bar$ was obtained. This is in strong contrast with the lower pure water flux of commercial polymer membranes between 1-7 L/($m^2 \cdot h \cdot bar$). Further increasing MLD cycles to 80 also generated a defect-free, hybrid MLD coating with pure water flux lower than our detection limit, and after calcination pure water flux increased to ~13 L/($m^2 \cdot h \cdot bar$). The decreased water flux is apparently due to the thicker $TiO_2$ coating on AAO surface and thus increased transport resistance.

It is interesting to find that the pure water flux of calcined AAO-20$TiO_2$ membrane was even higher than calcined bare AAO support, although pores of AAO are expected to become narrower after MLD coating. This may be attributed to the better stability of $TiO_2$ at elevated temperature, whereas alumina is much easier to dehydrate after thermal treatment and thus its surface becomes less hydrophilic.

2.4: Water Purification by $TiO_2$ Nanofiltration Membranes

Figure 8A:
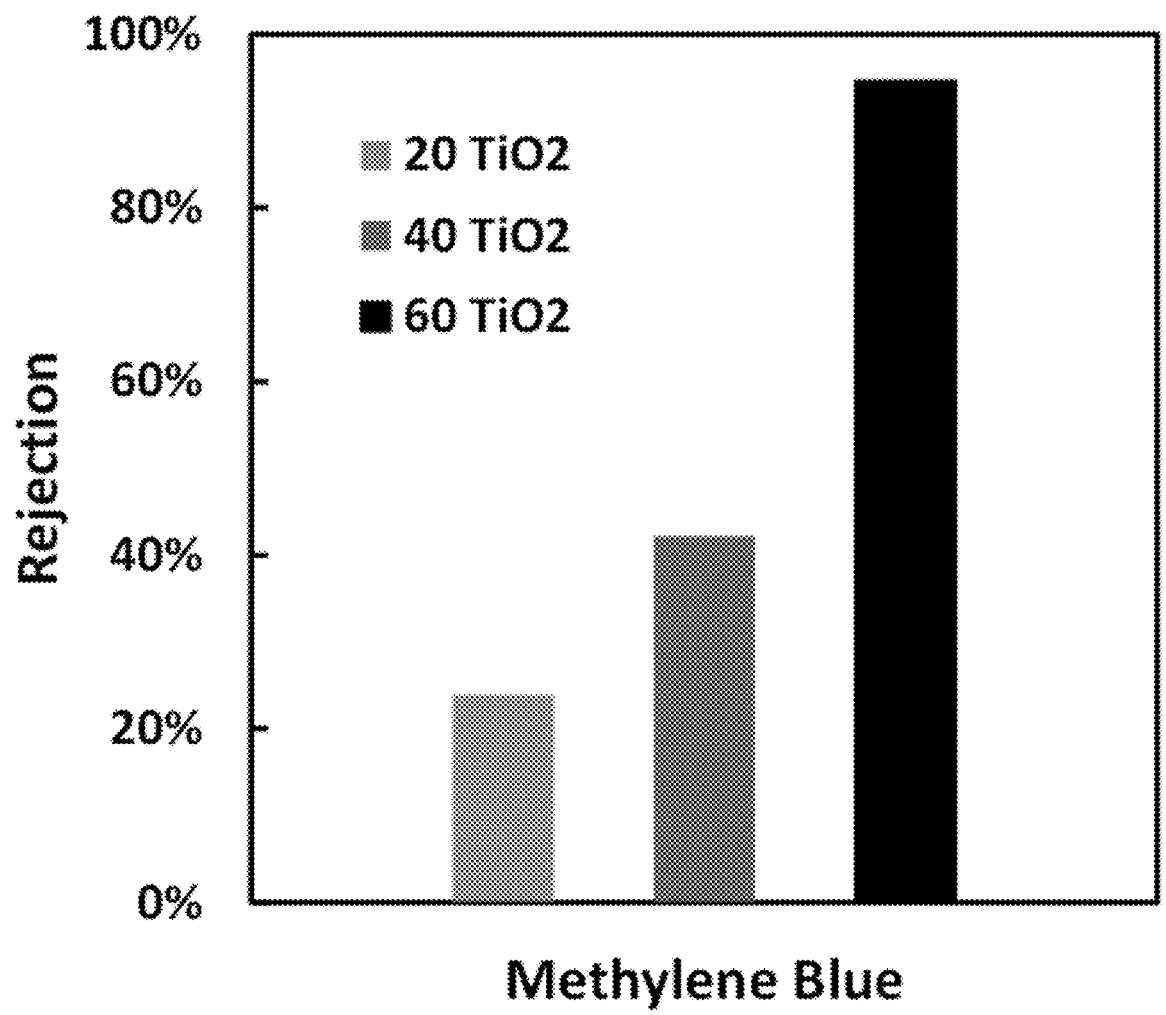
FIGS. 8a and 8b show the rejection of MB by TiO$_2$ coated AAO membranes, according to the Examples.
Figure 8B:
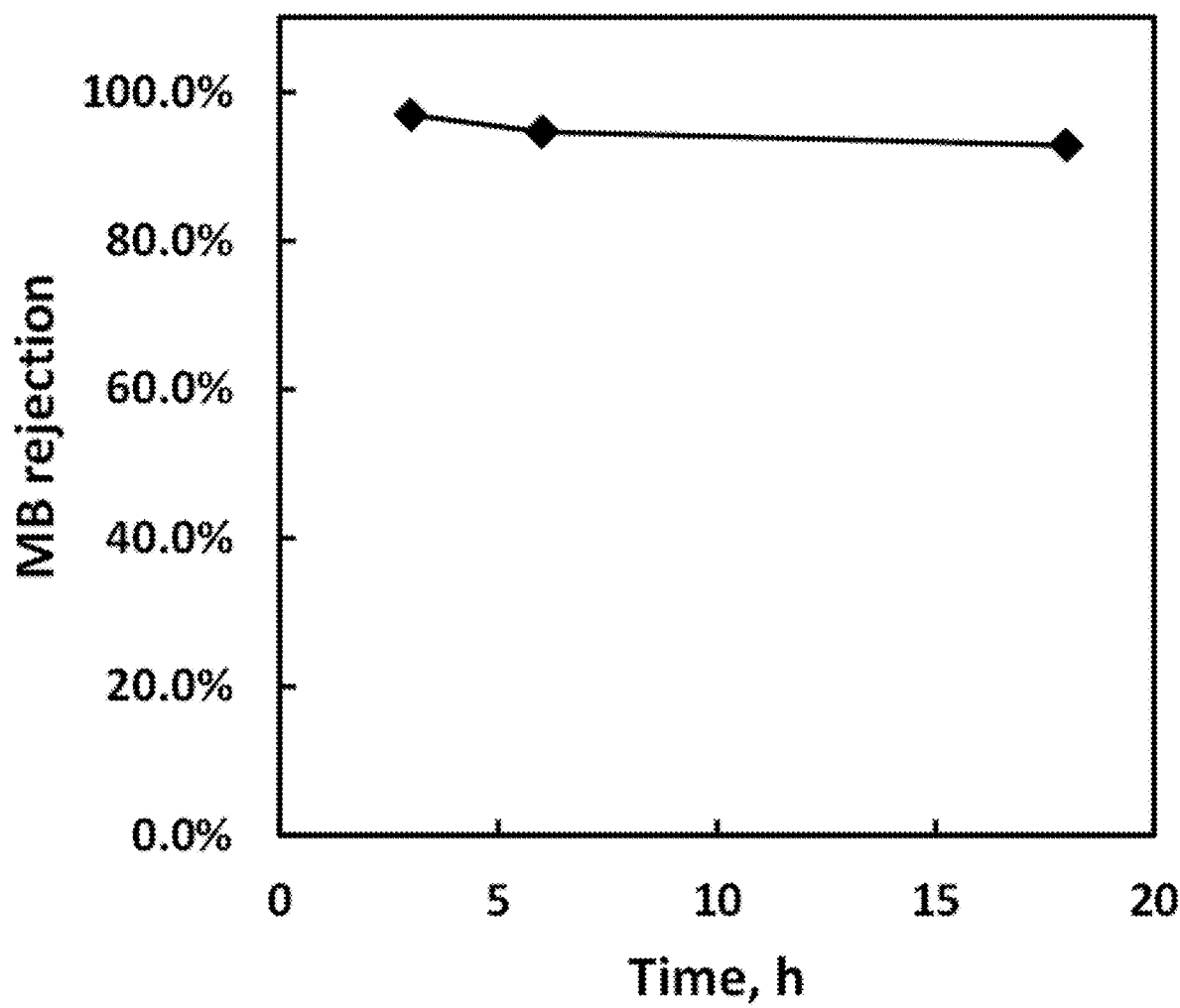
Figure 9:
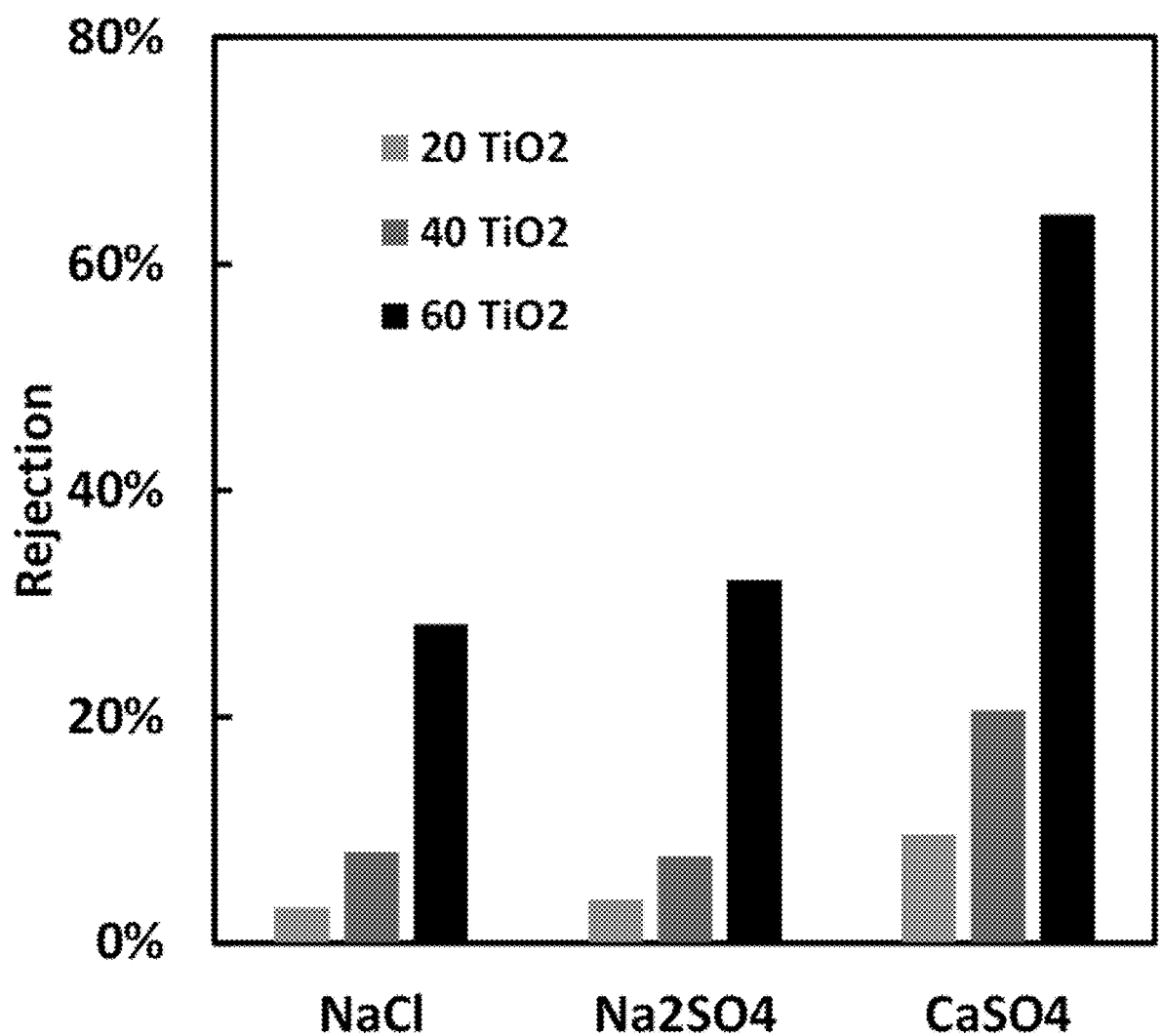
FIG. 9 shows the salt rejection by TiO$_2$ coated AAO membranes, according to the Examples.

The water purification performance of the $TiO_2$ nanofiltration membranes was investigated by measuring water flux and rejection for aqueous solutions of MB, NaCl, $Na_2SO_4$, and $CaSO_4$. As shown in FIGS. 8 and 9, the bare AAO support had almost no rejection for MB and salts. As the MLD cycles increased, the rejection for MB and salts increased due to the narrowed pore sizes. AAO-60$TiO_2$ membrane showed a high rejection (>96%) for MB after 3 h filtration; much longer time permeation only slightly decreased its rejection (~93% after 18 h). For the salt rejection, moderate rejection for NaCl and $Na_2SO_4$, 28% and 32%, respectively, was observed, and decent rejection (~64%) of $CaSO_4$ was obtained, as shown in FIG. 9. The observed order of salt rejection ($CaSO_4$>$Na_2SO_4$>NaCl) suggests steric exclusion is the dominant mechanisms. Also, the rejection of salts for our AAO-60$TiO_2$ membrane is comparable to that of membranes with pores of 1 nm in size.

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only, and is not intended to limit the invention so further described in the appended claims.

What is claimed:

1. A method to prepare $TiO_2$ nanofiltration membranes for water purification via a molecular layer deposition cycle, the method comprising:

supplying a titanium precursor gas into a reaction chamber that is under a vacuum, wherein the titanium precursor gas is introduced into the reaction chamber until a vapor pressure ranging from about 10 Pa to about 30 Pa is achieved, wherein the titanium precursor gas reacts with a base support of an anodic aluminum oxide, and wherein the base support of an anodic aluminum oxide has a surface defining a plurality of pores therein;

evacuating the reaction chamber to remove unreacted titanium precursor gas;

supplying an alkoxide precursor gas into a reaction chamber, wherein the alkoxide precursor gas is introduced into the reaction chamber until a vapor pressure ranging from about 3 Pa to about 20 Pa is achieved, wherein the alkoxide precursor gas reacts to with the titanium on the base support to form a hybrid titanium alkoxide;

repeating the steps of supplying the titanium precursor gas, evacuating the reaction chamber, and supplying the alkoxide precursor gas multiple times until the pores of the base support are filled with the hybrid titanium alkoxide; and thereafter, heating the base support to a temperature ranging from about 200° C. to about 250° C. to remove the organic component to leave a titanium oxide coating on the surface of the base support, wherein the titanium oxide coating is porous, wherein the titanium oxide pores have a pore size distribution ranging from about 0.6 nanometers to about 1.4 nanometers.

2. The method as in claim 1, wherein the titanium precursor gas is titanium tetrachloride.

3. The method as in claim 1, wherein the alkoxide precursor gas is ethylene glycol.

4. The method as in claim 1, wherein the plurality of pores defined by surface of the base support of the anodic aluminum oxide has an average diameter of about 10 nm to about 50 nm.

5. The method as in claim 1, wherein the plurality of pores defined by surface of the base support of the anodic aluminum oxide has an average diameter of about 15 nm to about 30 nm.

6. The method as in claim 1, wherein the base support has a temperature of about 50° C. to about 150° C. in the reaction chamber throughout the repeated steps.

* * * * *